LOW-FREQUENCY CORRECTING CIRCUIT FOR WIDE-BAND AMPLIFIERS

Original Filed March 19, 1963 2 Sheets-Sheet 1

INVENTOR.
JACQUES FOURNOL
BY
[signature]
AGENT

LOW-FREQUENCY CORRECTING CIRCUIT FOR WIDE-BAND AMPLIFIERS

Original Filed March 19, 1963 2 Sheets-Sheet 2

INVENTOR.
JACQUES FOURNOL
BY
AGENT

United States Patent Office 3,259,850
Patented July 5, 1966

3,259,850
LOW-FREQUENCY CORRECTING CIRCUIT FOR WIDE-BAND AMPLIFIERS

Jacques Fournol, Paris, France, assignor to North American Philips Company, Inc., New York, N.Y., a corporation of Delaware Continuation of application Ser. No. 266,281, Mar. 19, 1963. This application Aug. 10, 1965, Ser. No. 478,658
Claims priority, application France, Apr. 9, 1962, 893,761
4 Claims. (Cl. 330—164)

This application is a continuation of application Serial No. 266,281, filed March 19, 1963, now abandoned.

The invention relates to a low-frequency correcting circuit for wide-band amplifiers and more particularly to correcting circuits for television video amplifiers.

For the amplification of video frequencies resistance amplifier stages are commonly used which offer the advantage of giving a constant gain for all the frequencies in a given band.

This advantage is lost, however, when several capacitively coupled amplifier stages are connected in cascade, since the voltage is transferred from the anode of one tube to the grid of the succeeding tube by a shunt circuit comprising the coupling capacitor and the associated grid leak resistor. The value of the capacitor is limited in order to avoid the risk of damped or undamped oscillations and the grid resistor is also limited, with the result that the lower the frequency, the more is the gain decreased, this decrease of the gain being 6 db per octave below the cut-off frequency of the circuit constituted by the capacitor and the resistor.

It is known to obviate this disadvantage by connecting the parallel combination of a resistor and a capacitor in series with the anode load resistor of the tubes preceding these connections in a manner such that the gain at the level of these tubes is inversely proportional to the frequency so that a variation is produced in a sense opposite to that produced by the elements for connection to the succeeding tubes, thus bringing about a compensation for the above described phenomenon. This compensating circuit forms part of every amplifier for the purpose of decoupling the high-tension supply and preventing the stages from influencing one another through the supply.

In certain cases, however, such a compensating circuit for the very low frequencies has a considerable drawback; for optimum response of the amplifier, that is to say, for the voltage drop produced by the connecting elements to be effectively compensated by the decoupling elements in as much as their effects upon the voltage transferred oppose each other, it can be proved that the time constant of the circuit comprising the connecting elements must be equal to the time constant of the circuit comprising the decoupling elements and the anode load resistor.

In a wide-band amplifier the arrangement is made such that the value of the anode load resistor is small as compared with the value of the supply decoupling resistor. The value of the equivalent resistor of the said two resistors with respect to the decoupling capacitor can consequently be reduced to the value of the anode load resistor, and the time constant of the anode circuit can be considered equal to the product of the said load resistor and the capacitance of the capacitor.

A calculation will then show that, with the usual values of the anode load resistor, the coupling capacitor and the grid leak resistor, the value of the decoupling capacitor is very high and such that this capacitor is impracticable for comparatively high operating voltages when its physical dimensions are to be small.

It is the object of the present invention to provide a low-frequency compensating circuit for a wide-band amplifier which dispenses with a decoupling capacitor of high value in the anode supply circuit of the amplifier tubes.

The invention is mainly characterised in that in a resistance amplifier circuit comprising the cascade connection of at least two capacitively coupled amplifier tubes the anode of each amplifier tube is fed through an element of variable resistance connected in series with the anode load resistor and in which the output can be maintained constant, the signal taken from the said anode being integrated by means of an adjustable RC-circuit controlling the variable resistance element, while the time constant of this RC-circuit is set to a value such that the resistance variations produced in this manner in the variable resistance element modify the shape of this signal so as to compensate for the voltage drop produced by the circuit by which this tube is coupled to the succeeding tube.

The invention is also characterised in that the variable resistance element is an auxiliary tube connected as a cathode follower in series with the anode load resistor, the control grid of this tube being connected through a variable resistance to the anode of the associated amplifier tube and also through a capacitor to earth, the said coupling resistor and the said capacitor forming the above mentioned adjustable RC-circuit.

The invention may furthermore be characterised in that in an amplifying circuit using transistors the variable resistance element is an auxiliary transistor connected in series in the collector circuit of each amplifying transistor while each collector is connected through the load resistor of the stage to the emitter of the auxiliary transistor and also through a coupling resistor to the base of this auxiliary transistor, said base being connected to earth through a capacitor, while said coupling resistor and said capacitor form the above mentioned RC-circuit.

It should be noted that in the last mentioned circuit arrangement the output electrode of the transistor of a stage is connected to the base of the auxiliary transistor through the variable resistor which together with the said capacitor forms the RC-integrating circuit for the compensating signal. In this case a calculation shows that this resistor can be considered as a means for adjusting the value of the compensation introduced into the circuit by influencing the bias of the auxiliary transistor.

In a modified embodiment of the invention, if the amplifier is transistorized and the compensation is not exact, the collector of each amplifying transistor is connected through the load resistor of the stage to the emitter of the auxiliary transistor and also directly to the base of this auxiliary transistor, the impedance offered by this transistor in series with the impedance of the said capacitor determining the value of the resulting compensation.

In order that the invention may readily be carried into effect, an embodiment thereof will now be described, by way of example, with reference to the accompanying diagrammatic drawings, in which:

FIG. 1 shows partly two tubes T1 and T2, the anode circuit of the tube T1 comprising a load resistor R*a*, a decoupling resistor R*d* and a decoupling capacitor C*d*.

The connection to the grid of the tube T2, which grid is connected to earth through a grid leak resistor R*g*, includes a coupling capacitor C*l*.

Figure 1:
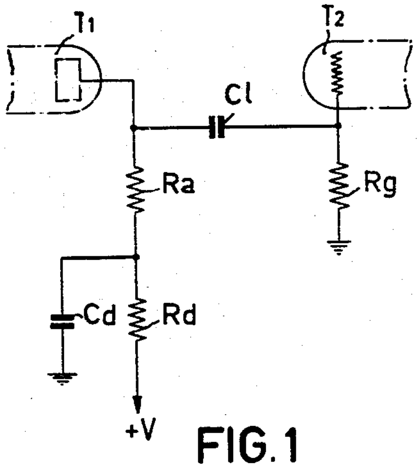
FIG. 1 shows the interstage circuit of a tube amplifier provided with compensation by a known method, while FIGS. 2 and 3 both are equivalent diagrams illustrating the principle on which the invention is based.

In an amplifier provided with resistance-capacity coupling, part of which is shown in FIG. 1, the value of the grid leak resistor R$g$, which in principle is comparatively large, should not exceed a certain limiting value in order not to give rise to grid currents which in turn may give rise to relaxation oscillations. Generally the value of the resistor R$g$ is limited to 1M ohm.

For reasons of physical dimensions and also to prevent the time constant of the circuit C$l$–R$g$ from becoming unduly large and giving rise to relaxation oscillations, the value of the capacitor C$l$ is limited to a few tenths of a microfarad.

However, a consideration of the circuit comprising C$l$ and R$g$ which couples the tubes T1 and T2 to each other shows that the alternating voltage taken from the terminals of the anode circuit of T1 is effectively transferred to the grid of T2 by a dividing bridge in the ratio $$r=\frac{Rg}{Rg+(1/jCl\omega)}=\frac{1}{1+(1/jRgCl\omega)} \qquad (1)$$

the voltage applied to the grid of T2 being decreased as the frequency of the transmitted signal and the time constant of the circuit R$g$–C$l$ are reduced.

Owing to the fact that for the reasons set forth hereinbefore the time constant, that is to say the values of R$g$ and C$l$, cannot be increased beyond certain limits, a considerable voltage loss must be accepted for the low frequencies, and the decrease in gain may reach 6 db per octave below the cut-off frequency of the circuit comprising R$g$ and C$l$.

It is known to obviate this disadvantage by inserting into the anode circuit of the tube T1 a capacitor-resistor circuit in series with the load resistor, this circuit being designated in FIG. 1 by C$d$ and R$d$, respectively. At the low frequencies such a circuit, which promotes the gain of the stage constituted by T2, permits of compensating in principle for the attenuation produced by the coupling circuits D1–R$g$. The gain of the stage can be written:

$$G=-SZa=-S\left(Ra+\frac{Rd}{1+jRdCd\omega}\right) \qquad (2)$$

where Z$a$ is the impedance of the anode load circuit and $\omega$ is the angular frequency of the transmitted signal.

This shows that the gain of the stage is higher in proportion as the frequency of the transmitted signal is lower, and this provides in principle the above mentioned compensation.

In order to obtain complete compensation the over-all gain must be rendered independent of the frequency that is to say the values of the elements R$a$, R$d$, C$d$ must be chosen as a function of the values of R$g$ and C$l$ so that the terms in $\omega$ cancel each other in the expression for this gain, that is to say, by combining (1) and (2).

$$G'=-S\left(Ra+\frac{Rd}{1+jRdCd\omega}\right)\left(\frac{1}{1+1/jRgCl\omega}\right)$$

The second factor of the second member of the expression, that is to say Z$a$, can be transformed:

$$Ra+\frac{Rd}{1+jRdCd\omega}=(Ra+Rd+jRaRdC(d\omega)\frac{1}{1+jRdCd\omega}$$

or $$Za=\frac{Ra+Rd}{1+jRdCd\omega}\left(1+j\frac{RaRd}{Ra+Rd}Cd\omega\right) \qquad (3)$$

In the case under consideration a wide-band amplifier is concerned, that is to say, an amplifier capable of passing signals the frequency of which may vary between a few cycles per second and several megacycles per second.

In such an amplifier the stray capacitances (cabling capacitance, capacitance between the anode and the electrodes of T1, grid-cathode capacitance of T2) assume such values at the high frequencies that they form effective short-circuits therefor when the load resistor R$a$ has a high value. Hence this latter value must be reduced to an extent such that at the high frequencies it is at least comparable to the impedance formed by the said stray capacitances.

In practice, in a video amplifier for a flying-spot generator we have, for example, the following values:

$$Ra=1.3\text{K}\Omega$$

and $$Rd=15\text{K}\Omega$$

In certain cases, R$a$ may even be smaller with respect to R$d$: as an example we may mention a stage for compensating for the image retention of the flying-spot tube, in which R$a$=110Ω and R$d$=15KΩ. Hence we may generally write:

$$Ra<<Rd$$

Under these circumstances, when we return to the expression (3)

$$Za=\underset{(m)}{\frac{Ra+Rd}{1+jRdCd\omega}}\ \underset{(n)}{\left(1+j\frac{RaRd}{Ra+Rd}Cd\omega\right)}$$

we may write $$m=\frac{Ra+Rd}{1+jRdCd\omega}=\frac{Rd}{1+jRdCd\omega}=\frac{1}{\frac{1}{Rd}+jCd\omega}=\frac{1}{jCd\omega}$$

(since R$d$ is large, $1/Rd$ is small) and $$n=1+jRaCd\omega$$

The expression Z$a$ then becomes:

$$Za=\frac{1}{jCd\omega}(1+jRaCd\omega)=Ra\left(1+\frac{1}{jRaCd\omega}\right) \qquad (4)$$

If now in the expression for G′ the value found (4) is substituted for Z$a$, we find $$G'=SRa\left(\frac{1+1/jRaCd\omega}{1+1/jRgCl\omega}\right)$$

To render the arrangement independent of the frequency, that is to say of the angular frequency $\omega$, we must have the following equation $$RaCd=RgCl$$

In the case of the image retention correcting amplifier mentioned hereinbefore, where $$Rd=15\text{K}\Omega \gg Ra$$
$$Ra=110\Omega$$

if we take the commonly used values $$Cl=0.1\mu f.$$
$$Rg=1\text{M}\Omega$$

then the capacitor $$Cd=\frac{RgC_1}{Ra}\#1000\mu f.$$

wherein the symbol refers to an approximation. This value is prohibitive by reason of the physical dimensions of such a capacitor to high operating voltages.

Figure 4:
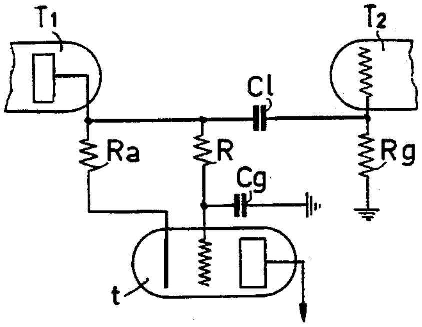
FIG. 4 is a schematic diagram of the correcting circuit in accordance with the invention using tubes.

According to the invention the compensation for the attenuation produced by the RC-coupling is effected in principle with the aid of an auxiliary tube $t$ which is connected as a cathode follower in the manner shown in FIG. 4. This circuit utilizes the property of a cathode follower stage that at the cathode side it offers a generally low impedance, the anode of the amplifier tube T1 being fed through the tube $t$.

The cathode load circuit of the tube $t$ actually consists of a resistance of high value (in practice R$g$ and the internal resistance of the amplifier tube in parallel).

Figure 2:
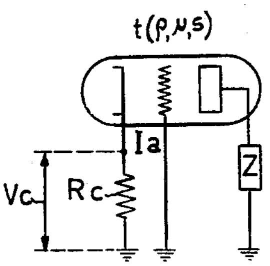

The anode and grid voltages of $t$ will be assumed constant. The equivalent diagram for variable operation then is shown in FIG. 2. It is assumed that $\rho$=the internal resistance of the tube *t*,
$S$=its slope,
$\mu$=its amplification factor,
$Ia$=the current flow through it,
$Vc$=the alternating voltage set up at the terminals of R*c*, the equivalent load resistance of the cathode circuit,
$Z$=an impedance of arbitrary value inserted in the anode circuit.

We can write $$Ia=\frac{\mu Vc-Vc}{Z+\rho}$$

from which can be deduced the value of the resistance viewed from the cathode $$r=\frac{Vc}{Ia}=\frac{\rho+Z}{\mu-1}$$

When a screen-grid tube having a high internal resistance, a large amplification factor and a steep slope, for example, a tube of the type EF42 (where $\rho=7000\Omega$ and $\mu\#80$), is connected as a triode and the impedance Z is low, Z can be neglected with respect to $\rho$ and 1 can be neglected with respect to $\mu$ and hence:

$$r\#\frac{\rho}{\mu}\#\frac{1}{S}$$

Figure 3:
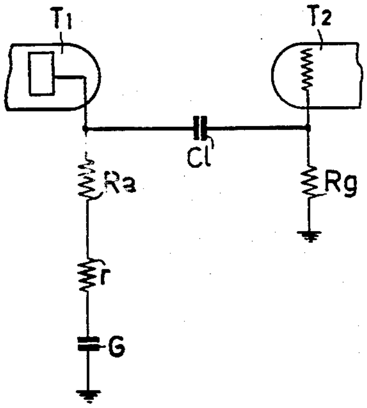

Consequently, if the slope is steep, *r* is so small that the tube *t* acts as a pure resistance of low value of which the base is completely decoupled, so that the equivalent diagram of the anode load resistor of the tube T1 is that shown in FIG. 3.

It will be noted, however, that under the mere conditions that *r* is small and R*a* cannot be large for the reason set forth hereinbefore, the value of G is still high and prohibitive if the above mentioned relationship $$RgCl=(Ra+r)G$$

is to be satisfied, which defines the compensation of the stage at the low frequencies. Hence one must resort to certain artifices which lead to the practical design of the circuit shown in FIG. 4.

Assuming that the voltage applied to the tube *t* is made variable by any known means, we have $$Ia=\frac{\mu(Vg-Vc)-Vc}{Z+\rho}$$

or $$Ia=\frac{\mu(Vg-Vc)-Vc}{\rho}$$

by neglecting Z after the manner set forth hereinbefore. Hence:

$$Ia=S(Vg-Vc)-\frac{Vc}{\rho}$$

and $$\frac{SVg}{Ia}=1+\frac{SVc}{Ia}+\frac{Vc}{\rho Ia}$$

$$\frac{Vg}{Ia}=\frac{1}{S}+\frac{Vc}{Ia}+\frac{Vc}{\mu Ia}$$

$$\frac{Vg}{Ia}=\frac{1}{S}+\frac{Vc}{Ia}\left(1+\frac{\mu}{1}\right)$$

If $\mu$ is large enough, we may write:

$$\frac{Vg}{Ia}=\frac{1}{S}+\frac{Vc}{Ia}$$

and the impedance *z* in the anode of the amplifier, that is to say $Vc/Ia$ is equal to $1/S-Vg/Ia$. For an effective compensation of the low frequencies this impedance must be reduced, as has been mentioned hereinbefore, to the form $z=A-j/G\omega$ or, by combining the two equations, $A-1/G\omega=1/S-Vg/Ia$ and by assimilating A to $1/S$, the equivalent value of the resistance offered by the tube *t*, $Vg=Ia/G\omega$. But it is still possible to write $$Vg=\frac{mIa}{mG\omega}=\frac{mIa}{Cg\omega}$$

where *m* is as small as may be desired and C*g* constitutes the grid load of the tube *t* traversed by the current I*a*. *m*I*a* can be obtained by taking part of the amplified voltage from the anode of the amplifying tube T1 through a large resistance.

This results in the circuit diagram shown in FIG. 4, in which the compensating tube *t* is connected as a cathode follower in the anode load circuit of the tube T1, while the grid load of the tube *t* is constituted by the capacitor C*g* traversed by the anode current owing to the presence of the resistance R which in this case is calculated in the following manner: We may write:

$$Ia\left[(Ra+r)-\frac{1}{G\omega}\right]\#\left(R-\frac{j}{mG\omega}\right)mIa$$

where *r* is approximately equal to $1/S$ (where S is the slope of the tube *t*), G is the theoretical value of the capacitance required for the compensation, *m* being such that *m*G, that is to say *m*C*g*, has a value which is acceptable in practice.

From this equation we have $$R\#\frac{Ra+r}{m}$$

Figure 5:
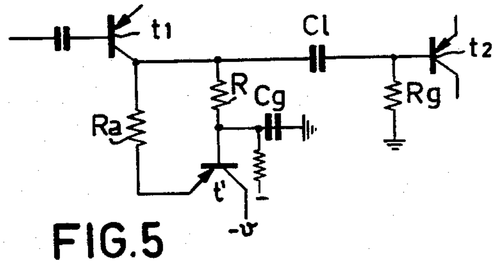
FIG. 5 is a schematic diagram of the correcting circuit in accordance with the invention using transistors.

FIG. 5 shows, by way of example, the schematic diagram of part of a compensating circuit in accordance with the invention which, however, is equipped with transistors. The same elements are used and their functions consequently need not be explained.

Figure 6:
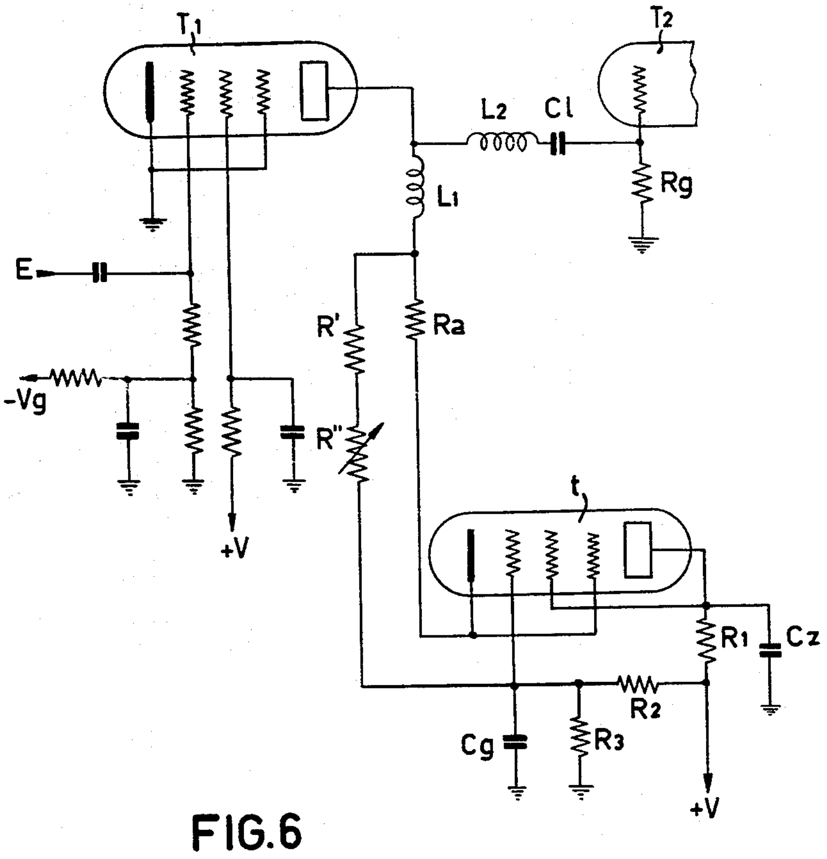
FIG. 6 is a practical circuit diagram of part of a video amplifier including a correcting circuit.

Finally FIG. 6 shows the practical and detailed circuit diagram of a video amplifier equipped with tubes and provided with a correcting circuit as shown in FIG. 4.

The tube *t* is a pentode tube connected as a triode, the anode load of which mainly consists of the capacitor C*z* which has a small low-frequency impedance. It is connected in the anode load circuit of the amplifier tube T1 in series with the resistance R*a* and a correcting coil L1 which is conventionally used in circuits of this type.

The anode current flows through the grid load of the tube *t*, which load consists of the capacitor C*g*, by way of a resistor R′ and a potentiometer R″. This potentiometer permits of adjusting the introduced compensation.

In a practice a square signal having a very low frequency is applied at E to the grid of the tube T1. While observing the signal taken from the grid of the stage consisting of the tube T2, the potentiometer R″ is adjusted so that the porches appear as horizontal as possible to the eye.

With the values given hereinafter adjustment may be effected without visible distortion of the rectangular signal when its period is 1/50 sec.

The fixed bias of the grid of the tube *t* is taken from a voltage divider R2–R3.

The cathode-grid circuits of the tube T1 are of the conventional type and its connection to the succeeding tube, which connection comprises the capacitor C*l* and the grid leak resistor R*g*, also includes a conventional correcting coil L2. The coils L1 and L2 provide a mixed series-parallel compensation for the high frequencies.

The values of the elements which are characteristic of the circuit are the following:

| | |
|---|---|
| T1, T2, *t* | Tubes of the type EF42. |
| R′ | 390KΩ. |
| R″ | 1MΩ. |
| R*a* | 1.3KΩ. |
| C*l* | 0.25$\mu$f. |
| R*g* | 1MΩ. |
| O*g* | 0.25$\mu$f. |

| | |
|---|---|
| R1 | 5.1KΩ. |
| Gz | 32μf. |
| R2 | 1MΩ. |
| R3 | 1MΩ. |

Obviously the circuit shown in FIG. 6 may be equipped with transistors by taking into consideration the modifications of values and connections inherent in the use of these elements, while the principle of the compensation, that is to say, the principle of the invention, remains exactly the same. It will be appreciated that the preceding description has been given by way of non-limitative example and that modifications especially with respect to the form of the circuit when it is equipped with transistors (paricularly, the resistor R can be omitted if no exact compensation is wanted), may be performed without departing from the scope of the invention.

What is claimed is:

1. A wide band amplifying circuit comprising; a first amplifying stage for receiving the signal to be amplified; a second amplifying stage; first capacitive means connecting the output of the first stage with the input of the second stage; impedance means connecting the input of said second stage to a source of reference potential; load means connected to the output of said first stage; a third amplifying stage including a control electrode, said third amplifying stage being connected between said load means and a source of constant potential; and second capacitive means connecting said control electrode to said source of reference potential whereby the impedance of said third stage varies as a function of signal frequency to provide a flat frequency characteristic for the amplifier circuit over a wide frequency band.

2. A wide band amplifying circuit comprising; a first amplifying stage for receiving the signal to be amplified; a second amplifying stage; first capacitive means connecting the output of the first stage with the input of the second stage; impedance means connecting the input of said second stage to a source of reference potential; load means connected to the output of said first stage; a third amplifying stage including a control electrode, said third amplifying stage being connected between said load means and a source of constant potential; means connecting the output of said first amplifying stage to said control electrode; and second capacitive means connecting said control electrode to said source of reference potential whereby the impedance of said third stage varies as a function of signal frequency to provide a flat frequency characteristic for the amplifier circuit over a wide frequency band.

3. A wide band amplifying circuit comprising; a first vacuum tube amplifier stage having cathode, grid and plate electrodes; a second vacuum tube amplifier stage including a control grid electrode; capacitive coupling means interconnecting the plate electrode of said first stage and the control grid electrode of said second stage; impedance means coupling the control grid of said second stage to a source of reference potential; load circuit means connected to the plate electrode of said first stage; a third vacuum tube amplifier stage having a cathode connected to said load circuit means, a plate electrode connected to a first source of supply voltage and a control grid electrode connected to the plate electrode of said first stage by resistive means and to said source of reference potential by capacitive means whereby the impedance between the cathode and plate electrodes of said third stage varies as a function of the signal frequency applied to said first stage to provide a flat frequency characteristic for the amplifier circuit over a wide frequency band.

4. A wide band amplifying circuit comprising; a first transistor amplifier stage having a common, input and output electrode; a second transistor amplifier stage including an input electrode; capacitive coupling means interconnecting said output electrode of said first stage and the input electrode of said second stage; impedance means coupling the input electrode of said second stage to a source of reference potential; load circuit means connected to said output electrode of said first stage; a third transistor amplifier stage having an emitter electrode connected to said load circuit means, a collector electrode connected to a first source of supply voltage and a base electrode connected by resistive means to the output electrode of said first stage and to said source of reference potential by capacitive means whereby the impedance between the emitter and collector of said third stage varies as a function signal frequency applied to said first stage input electrode to provide a flat frequency characteristic for the amplifier circuit over a wide frequency band.

References Cited by the Examiner

UNITED STATES PATENTS 3,024,423 3/1962 Azelickis et al. ------- 330—71

FOREIGN PATENTS 954,531 6/1949 France.

ROY LAKE, *Primary Examiner.*

NATHAN KAUFMAN, *Examiner.*